(12) United States Patent
Li et al.

(10) Patent No.: US 7,488,945 B2
(45) Date of Patent: Feb. 10, 2009

(54) SUBPIXEL ROUTING AND PROCESSING FOR AN IMAGING SYSTEM OR THE LIKE

(75) Inventors: Wen Li, Clifton Park, NY (US); John Eric Tkaczyk, Delanson, NY (US); Yanfeng Du, Rexford, NY (US); James Leblanc, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 349 days.

(21) Appl. No.: 11/291,273

(22) Filed: Nov. 30, 2005

(65) Prior Publication Data
US 2007/0120062 A1     May 31, 2007

(51) Int. Cl.
    *G01T 1/24*     (2006.01)
(52) U.S. Cl. ................................. 250/370.09
(58) Field of Classification Search ................................
    250/370.01–370.15, 363.05, 363.09, 363.07,
    250/252.1; 378/19, 207
See application file for complete search history.

(56) References Cited

U.S. PATENT DOCUMENTS

| 5,508,507 A | * | 4/1996 | Nelson et al. ......... 250/214 LA |
| 2006/0056581 A1 | * | 3/2006 | Hoffman et al. ............... 378/19 |
| 2007/0071168 A1 | * | 3/2007 | Allison et al. .................. 378/65 |

* cited by examiner

*Primary Examiner*—David P. Porta
*Assistant Examiner*—Kiho Kim
(74) *Attorney, Agent, or Firm*—Jason K. Klindtworth (57) ABSTRACT

Count rates may be obtained from one or more subpixels for a given pixel in an imaging system detector. Count rates may be obtained from individual subpixels, or may be from electronically binned subpixels at least in part in various subpixel arrangements where a selected subpixel arrangement may be adaptively set according to a detected count rate. For lower count rates, two or more subpixels may be electronically binned together and the counts may be obtained from the binned subpixels, for example to mitigate a charge sharing effect. For higher count rates, the count rates of a greater number of subpixels may be individually obtained, for example to mitigate a pulse pile-up effect. Detective quantum efficiency may be optimized over a wider range of photon flux rate via the adaptive subpixel arrangement.

17 Claims, 7 Drawing Sheets

SUBPIXEL ROUTING AND PROCESSING FOR AN IMAGING SYSTEM OR THE LIKE

BACKGROUND

In imaging systems having direct conversion detectors, binning may refer to the combining of detected charge onto one or more common readout channels, for example among adjacent pixels of the direct conversion detectors. A detector of the imaging system may be utilized to detect x-ray photons to be converted into an electrical signal representative of an image of a target. Flux rate may be defined as a number of x-ray photons per unit area for an imaging x-ray beam. The detector counts the number of photons impinging thereupon to provide a count rate, which may refer to a counted number of photons impinging upon given pixel area per unit time. At higher count rates, a pixel having a predefined area may receive more photons per unit time which may result in a greater opportunity for pile-up. In such a situation, the chance for overlap of the signal pulses from the absorption of two or more photons may be increased. Pile-up may result in a loss of photon counting information and thus an unutilized and/or wasted x-ray dose. Pixels of the direct conversion detector may be divided into multiple subpixels of smaller area that may be served by individual charge integrating amplifiers, shapers, discriminators and/or counting circuits in order to increase the flux rate capability of the detector. The flux rate capability may be increased since each subpixel has a smaller area and therefore receives fewer photons per second at given flux rate and will thus count fewer photons per unit time, the count rate. The count rate capability may be increased roughly by the ratio of area of the subpixel into the original or whole pixel area. For example, a pixel divided into four subpixels may result in one fourth the count rate per subpixel as compared to the whole pixel, if charge sharing among subpixels is negligible. However, the subdivision of a pixel into multiple subpixels with smaller areas may also increase the amount of charge sharing. Small area subpixels also have a larger perimeter to area ratio. The percentage of the area where x-rays absorption will result in sharing of charge between neighboring pixels is increased as the pixel size is decreased. Charge sharing may result in missed counts, for example if the received charge level in two subpixels is below a discriminator threshold. Alternately, double counts from one photon event may occur if the received charge in two subpixels both exceeds the discriminator threshold. Miscounting therefore is a loss or degradation of information. Such a loss due to charge sharing may increase with finer subdivision of the pixel into more and/or smaller sized subpixels.

DESCRIPTION OF THE DRAWING FIGURES

Claimed subject matter is particularly pointed out and distinctly claimed in the concluding portion of the specification. However, both as to organization and/or method of operation, together with objects, features, and/or advantages thereof, may best be understood by reference to the following detailed description when read with the accompanying drawings in which:

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding or analogous elements.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

Some portions of the detailed description that follows are presented in terms of algorithms, programs and/or symbolic representations of operations on data bits or binary digital signals within a computer memory, for example. These algorithmic descriptions and/or representations may include techniques used in the data processing arts to convey the arrangement of a computer system and/or other information handling system to operate according to such programs, algorithms, and/or symbolic representations of operations.

An algorithm may be generally considered to be a self-consistent sequence of acts and/or operations leading to a desired result. These include physical manipulations of physical quantities. Usually, though not necessarily, these quantities take the form of electrical and/or magnetic signals capable of being stored, transferred, combined, compared, and/or otherwise manipulated. It has proven convenient at times, principally for reasons of common usage, to refer to these signals as bits, values, elements, symbols, characters, terms, numbers and/or the like. It should be understood, however, that all of these and/or similar terms are to be associated with the appropriate physical quantities and are merely convenient labels applied to these quantities.

Unless specifically stated otherwise, as apparent from the following discussions, it is appreciated that throughout the specification discussion utilizing terms such as processing, computing, calculating, determining, and/or the like, refer to the action and/or processes of a computer and/or computing system, and/or similar electronic computing device, that manipulate or transform data represented as physical, such as electronic, quantities within the registers and/or memories of the computer and/or computing system and/or similar electronic and/or computing device into other data similarly represented as physical quantities within the memories, registers and/or other such information storage, transmission and/or display devices of the computing system and/or other information handling system.

Embodiments claimed may include apparatuses for performing the operations herein. This apparatus may be specially constructed for the desired purposes, or it may comprise a general purpose computing device selectively activated and/or reconfigured by a program stored in the device. Such a program may be stored on a storage medium, such as, but is not limited to, any type of disk including floppy disks, optical disks, CD-ROMs, magnetic-optical disks, read-only memories (ROMs), random access memories (RAMs), electrically programmable read-only memories (EPROMs), electrically erasable and/or programmable read only memories (EEPROMs), flash memory, magnetic and/or optical cards, and/or any other type of media suitable for storing electronic instructions, and/or capable of being coupled to a system bus for a computing device and/or other information handling system.

The processes and/or displays presented herein are not inherently related to any particular computing device and/or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments are not described with reference to any particular programming language. It will be appreciated that a variety of programming languages may be used to implement the teachings described herein.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

Figure 1:
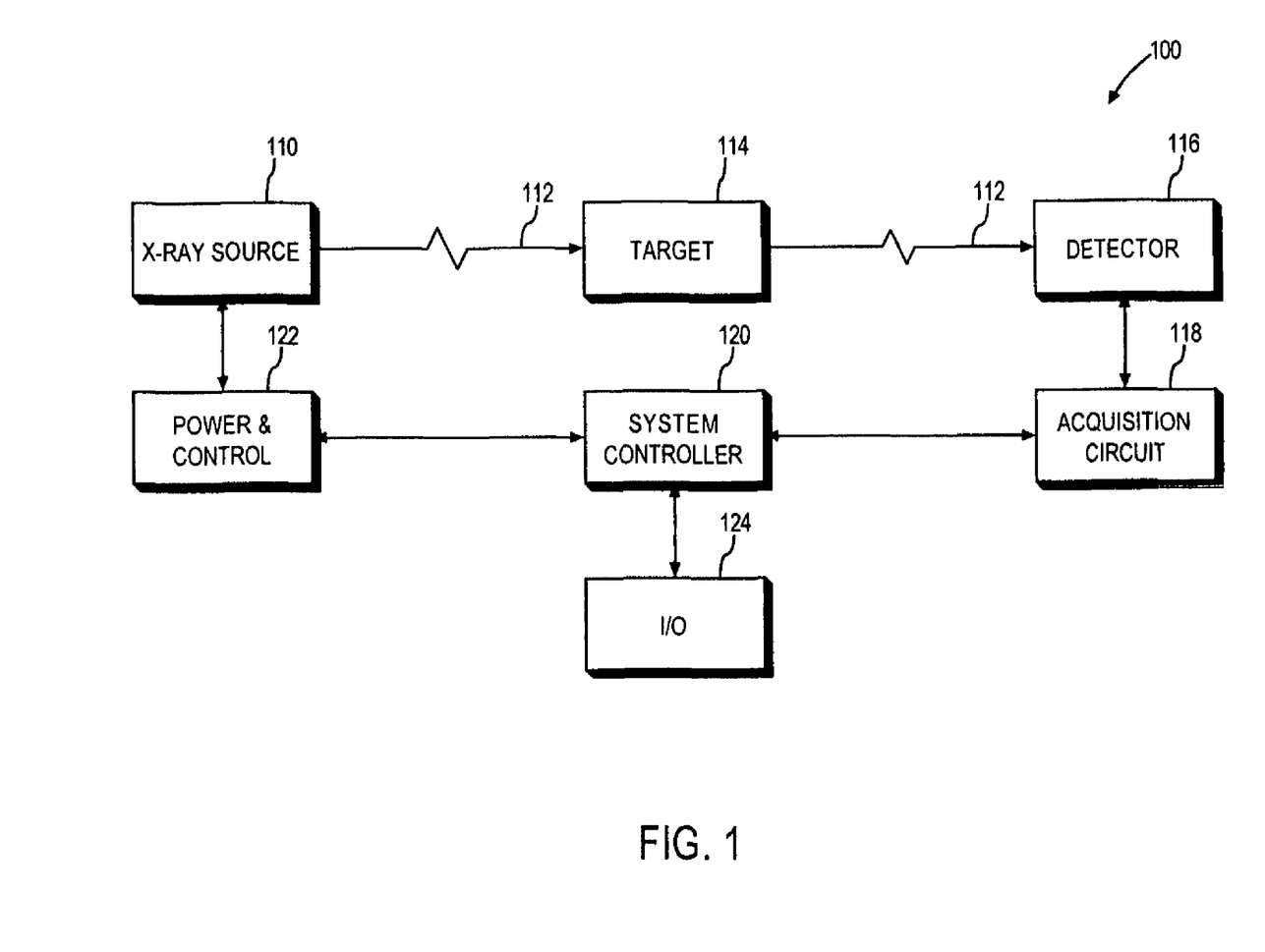
FIG. 1 is a block diagram of an imaging system in accordance with one or more embodiments.

Referring now to FIG. 1, a block diagram of an imaging system in accordance with one or more embodiments will be discussed. As shown in FIG. 1, imaging system 100 may include x-ray source 110 that is capable of generating and emitting photons 112 suitable for producing an image. In one or more alternative embodiments, x-ray source may be any type of source capable of emitting particles or waves suitable for producing an image, and the scope of the claimed subject matter is not limited in this respect. Photons 112 may impinge upon target 114, which may be, for example an animal and/or human target where imaging system 100 is utilized in medical applications. Alternatively, target 114 may be any suitable target where an image of target 114 may be desirable, for example in inspection of manufactured parts, although the scope of the claimed subject matter is not limited in this respect. At least a portion of photons 112 may pass through target 114 at varying flux levels corresponding at least in part to a density of portions of target 114 where such photons 112 passing through target 114 may be detected by detector 116.

Based at least in part on the varying flux levels of photons 112 detected by detector 116, detector 116 may provide an output signal to acquisition circuit 118 that is capable of generating an image, and/or data representative of an image, of target 114 from the output signal.

System controller 120 may receive the image generated by acquisition circuit 118 and may perform various control and processing functions for imaging system 100. For example, system controller 120 may couple with power and control unit 122 to control the operation of x-ray source 110. Likewise, system controller 120 may control the operation of acquisition circuit 118 and/or detector 116, and may be further coupled to an input/output (I/O) system 124. I/O system 124 may include one or more controls for allowing an operator to operate imaging system 100, and/or may couple to one or more devices for displaying and/or storing images of target 114 captured by detector 116. For example, I/O system 124 may couple to a liquid-crystal display (not shown) or the like for displaying images captured by detector 116. Furthermore, I/O system 124 may couple to a hard disk drive or other types of storage media for storing images captured by detector 116. In one or more embodiments, I/O system 124 may couple to a network adaptor, modem, and/or router (not shown), for example to send images captured by detector to other devices and/or nodes on a network. Furthermore, such a network adaptor, modem, and/or router may allow a remoter operate to download and/or view images capture by detector 116, for example as captured and stored as data files, and/or to receive and/or view such images in real-time or in near real-time, and/or to otherwise control the operation of imaging system 100 from a remote location for example from a machine coupled to imaging system 100 via the Internet. However, these are merely examples of embodiments for control of and/or communication with imaging system 100, and the scope of the claimed subject matter is not limited in these respects.

In one or more embodiments, system controller 120 may include at least one or more processors for executing control functions of imaging system 100, for controlling the image capturing process of imaging system 100, and/or for electronic processing of images capture by detector 116. In one or more embodiments, system controller 120 may include one or more general purpose processors having one or more processor cores, and in one or more embodiments system controller 120 may include one or more special purpose processors such as a digital signal processor, for example to perform image processing on images captured by detector 116. In one or more embodiments, system controller 120 may comprise a general purpose computer platform, workstation, and/or server, and in one or more alternative embodiments, system controller 120 may comprise a special purpose platform designed for imaging tasks. However, these are merely example embodiments of system controller 120, and the scope of the claimed subject matter is not limited in these respects.

In one or more embodiments, detector 116 may be a semiconductor based detector 116, for example an array of semiconductor diode detectors capable of detecting photons 112 emitted from x-ray source 110. Such a semiconductor based detector may be referred to as a direct conversion detector capable of converting photons 112 from x-ray source 110 into an electrical signal representative of an image of target 114. The semiconductor diode detectors in such an array may include corresponding transistors, for example thin film transistors (TFTs) and other circuits for controlling the array of semiconductor diode detectors, and for reading signals from the diode detectors based at least in part on the flux and/or intensity of photons 112 impinging on the diode detectors. In one or more embodiments, detector 116 may comprise an array of pixels with each pixel or at least some pixels comprising one or more subpixels that may be served by individual charge integrating amplifiers, shapers, discriminators and/or counting circuits.

Figure 2:
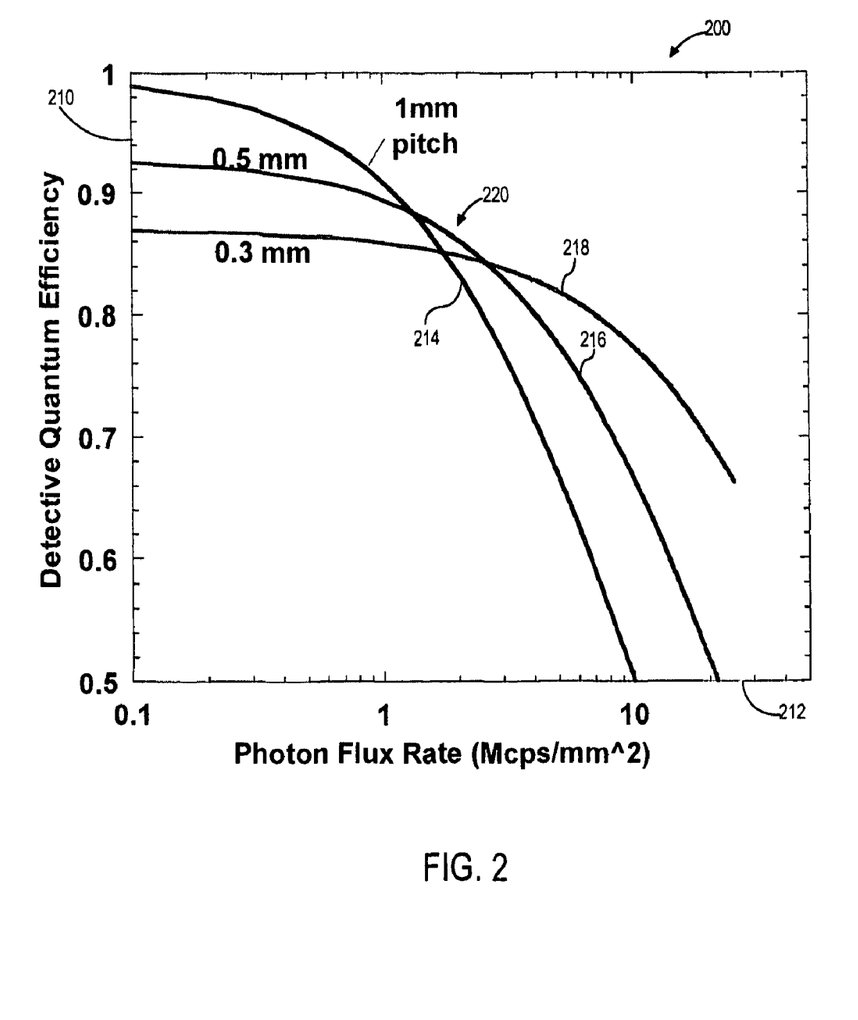
FIG. 2 is a plot of detective quantum efficiency versus photon flux rate for an imager of an imaging system in accordance with one or more embodiments.

Referring now to FIG. 2, a plot of detective quantum efficiency at zero or near zero spatial frequency versus photon flux rate for an imager of an imaging system in accordance with one or more embodiments will be discussed. As shown in FIG. 2, graph 200 shows detective quantum efficiency (DQE) on axis 210 versus photon flux rate on axis 212 in units of megahertz per square millimeter (Mcps/mm²). In one or more embodiments, in imaging system 100, higher x-ray dose utilization at lower and higher count rates may be achieved for a photon counting or energy discriminating detector such as detector 116 by adaptively binning or not binning subpixels of a given pixel of detector 116 as a function of flux rate of photons 112 impinging on detector 116. FIG. 2 shows the tradeoff between charge sharing and pile-up. The detective quantum efficiency (DQE) is plotted as a function of count rate (photon flux rate) for different pixel pitch designs. Plot 214 represents a pixel pitch of 1 millimeter, plot 216 represents a pixel pitch of 0.5 millimeters, and plot 218 represents a pixel pitch of 0.3 millimeters. At lower count rates, larger pixel pitches have the higher DQE due to a minimum amount of charge sharing and lower pile-up. However, the pile-up effect increases, and DQE decreases more quickly with increasing count rate for larger pixel pitches. The DQE for 1 mm pitch at plot 214 falls more rapidly at higher count rates as shown in FIG. 2. Conversely, smaller pixel pitches have lower DQE at lower count rates but are less susceptible and more robust to pile-up at higher count rates. In general, smaller pixel sizes have a higher DQE at the higher count rate limit. Cross-over region 220 between pixel pitches may be determined via modeling or via direct measurement, although the scope of the claimed subject matter is not limited in this respect.

Figure 3:
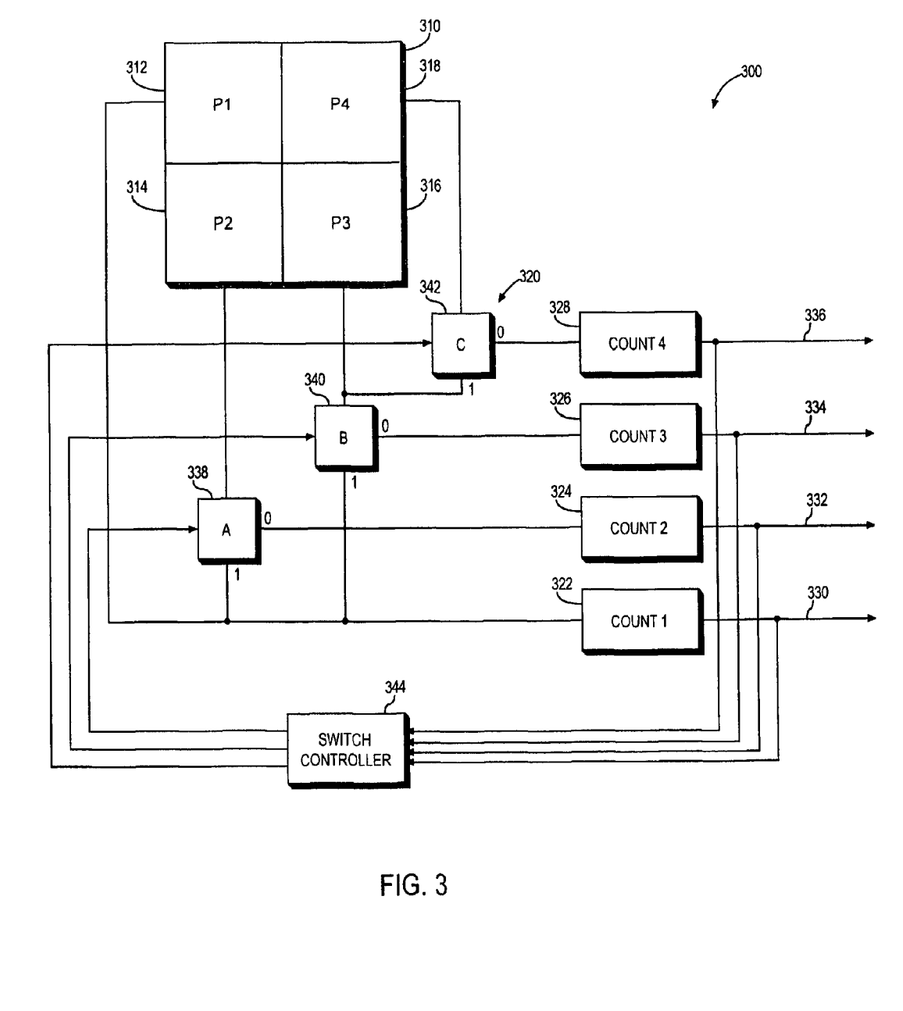
FIG. 3 is a diagram of a count control circuit having one counting circuit per subpixel in accordance with one or more embodiments.

Referring now to FIG. 3, a diagram of a counting pixel having multiple subpixels and one counting circuit per subpixel in accordance with one or more embodiments will be discussed. As shown in FIG. 3, count control circuit 300 may comprise one or more pixels 310 of detector 116, where pixel 310 may be subdivided in the embodiment shown into four subpixels, pixel (P1) 312, pixel (P2) 314, pixel (P3) 316, and/or pixel (P4) 318. In one or more embodiments, charge from subpixels 312-318 occurring due to impinging photons 112 may be adaptively routed through switch network 320 via count circuits 322, 324, 326, and/or 328 to readout channels 330, 332, 334, and/or 336 in order to implement a pixel binning arrangement based at least in part on the flux density of photons 112. Switch network 320 may comprise one or more switches including switch (A) 338, switch (B) 340, and/or switch (C) 342 which may be, for example, field-effect transistor (FET) switches located on the same substrate as the readout electronics, or alternatively may be embedded in a readout chip. In one or more embodiments, switches 338-342 may be single pole, double throw (SPDT) type switches or the like. In one or more embodiment, switches 338-342 may be disposed on an interposer between a direct conversion sensor and a substrate of the readout electronics, although the scope of the claimed subject matter is not limited in this respect.

In one or more embodiments, to determine what connections are to be made to subpixels 312-318, before an x-ray view or scan, switch controller 344 may first make an estimate of the count rate likely to be received at pixel 310, for example based at least in part on a setting of power and control unit 122. Alternately, switch controller 344 may determine an initial count rate based at least in part on one or more previous x-ray viewings or scans. In one or more embodiments, switch controller 344 may implement a binning configuration for subpixels 312-318 of pixel 310 based at least in part on a lookup table. Such a lookup table may be arranged, for example, to maximize the detective quantum efficiency as a function of count rate, where the table entries may be based at least in part on graph 200 in one or more embodiments. For the arrangement of counting circuit 300 shown in FIG. 3, such a lookup table may comprise the following:

TABLE 1

| Switch | Count Rate | | |
|---|---|---|---|
| | Lower | Middle | Higher |
| Switch A | 1 | 1 | 0 |
| Switch B | 1 | 0 | 0 |
| Switch C | 1 | 1 | 0 |

As shown in Table 1, for lower count rates, switch controller 344 may arrange switches 338-342 to be in position 1 as shown in FIG. 3. In such an arrangement, switches 338-342 couple subpixels 314-318 to the same count circuit, count circuit 322, along with subpixel 312 to provide a combined output at readout channel 330 thereby minimizing and/or avoiding errors due to charge sharing phenomenon, although the scope of the claimed subject matter is not limited in this respect.

For a middle range of count rate, switch controller 344 may arrange switches 338 and 342 to be in position 1, and may arrange switch 340 to be in position 0 as shown in FIG. 3. In such an arrangement, switch 338 may couple subpixel 314 to count circuit 322 to provide a combined output from subpixels P1 and P2 at readout channel 330. Likewise, switch 340 and switch 342 may couple subpixel 316 and sub pixel 318 to count circuit 326 to provide a combined output from subpixels P3 and P4 at readout channel 334. In such an arrangement, the smaller area of a subpixel pair of two combined subpixels such as subpixel 312 and subpixel 314 compared to the total size of pixel 310 may result in less pile-up phenomenon, although the scope of the claimed subject matter is not limited in this respect.

For higher count rates, switch controller 344 may arrange switches 338, 340, and 342 to be in position 0 as shown in FIG. 3. In such an arrangement, subpixel 312 may couple to count circuit 322 to provide an output to readout channel 330, subpixel 314 may couple to count circuit 324 to provide an output to readout channel 332, subpixel 316 may couple to count circuit 326 to provide an output at readout channel 334, and subpixel 318 may couple to count circuit 328 to provide an output at readout channel 336. In such a higher count rate arrangement, a given one of subpixels 312-318 may receive about one-fourth the count rate compared to the count rate receive by pixel 310 as a whole, and as a result may incur a lesser amount of pile-up loss, although the scope of the claimed subject matter is not limited in this respect. In any one or more of the arrangements for lower count rate, middle count rate, and/or higher count rate, the outputs of pixels 312-318 may be converted from an analog signal into a digital signal, for example using count circuits 322-328, and the digital signals may combined and/or scaled as appropriate to represent a signal from pixel 310 as a whole. For example, at a higher count rate where subpixels 312-318 are connected to separate one of count circuits 322-328, then the four digital signals may be added to form an output value for the pixel 310 as a whole, although the scope of the claimed subject matter is not limited in this respect.

In order to determine whether the count rate is in a lower range, a middle range, or a higher range, switch controller 344 may couple to the output of count circuits 322-328 in a feedback arrangement so that switch controller 344 may determine appropriate switch settings for switches 338, 340, and/or 342, for example according to Table 1. The count rate ranges may be based at least in part on graph 200 of FIG. 2 and/or the known and/or experimental plots of DQE versus flux rate for a given pitch of subpixels 312-318, although the scope of the claimed subject matter is not limited in this respect. In one or more embodiments, switch controller 344 may be a logic circuit arranged and/or programmed to implement the switching function described above and in Table 1, or alternatively switch controller 344 may be a software program and/or module executable by a processor of imaging system 100. In one or more embodiments, switch controller 344 may be embodied as one or more of circuitry, firmware, and/or software, disposed in one or more of detector 116, acquisition circuit 118, and/or system controller 120, although the scope of the claimed subject matter is not limited in this respect.

In one or more embodiments, the adaptive selection of the number and/or combination of subpixels 312-318 for a given pixel 310 may operate to reduce, mitigate, and/or eliminate saturation of detector 116 by providing an optimal and/or desired selection between charge sharing and pile-up degradation of the DQE. Such an arrangement as shown in and described with respect to FIG. 3 of adaptively routing and/or combining the outputs of subpixels 312-318 may be compared to adaptively selecting among plots 214, 216, and/or 218 of FIG. 2, for example to select a pitch at a given count rate that results in a highest or at least nearly the highest DQE by selecting a pitch of subpixels 312-318, although the scope of the claimed subject matter is not limited in this respect.

Figure 4:
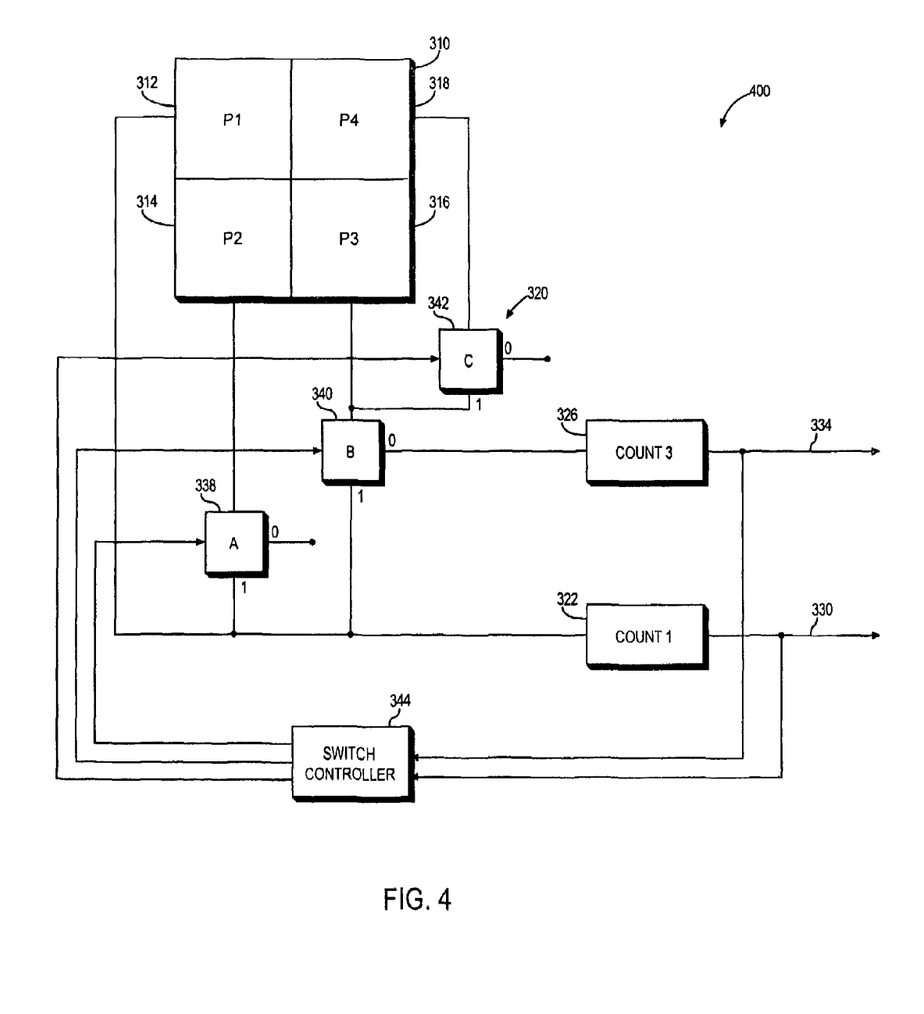
FIG. 4 is a diagram of a count control circuit having fewer counting circuits than subpixels in accordance with one or more embodiments.

Referring now to FIG. 4, a diagram of a subpixel count control circuit having fewer counting circuits than subpixels in accordance with one or more embodiments will be discussed. Count control circuit 400 as shown in FIG. 4 is substantially similar to count control circuit 300 of FIG. 3 with the exception being that with count control circuit 400 the number of count channels and the number of count circuits is less than the number of subpixels for a given pixel. As a result, the switching connections may also be different. Table 1 as described with respect to count control circuit 300 of FIG. 3 may also be utilized for count control circuit 400 of FIG. 4. For lower and middle count rates there is no difference in the operation of count control circuit 400 and for lower and middle count rates in the operation of count control circuit 300 of FIG. 3. However at higher count rates only two channels are available to be read out wherein subpixel 312 may couple to count circuit 322 to provide an output at readout channel 330 and subpixel 316 may couple to count circuit 326 to provide an output to readout channel 334. The terminals of switch 338 and switch 342 may be in the 0 position where the 0 terminal of the switches may be grounded, for example, wherein subpixel 314 and/or subpixel 318 may be grounded, and no readout is obtained from them, although the scope of the claimed subject matter is not limited in this respect.

Figure 5:
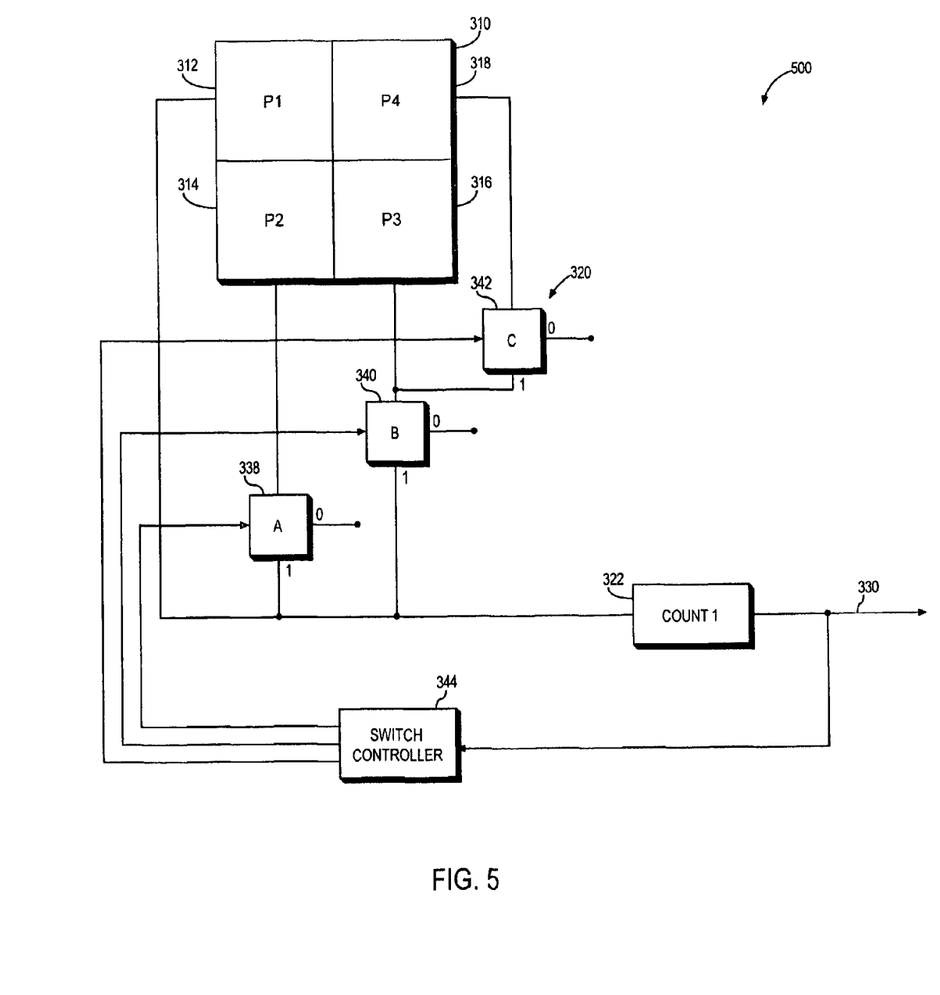
FIG. 5 is a diagram of a count control circuit having one counting circuit for all subpixels in accordance with one or more embodiments.

Referring now to FIG. 5, a diagram of a subpixel count control circuit having one counting circuit for all subpixels in accordance with one or more embodiments will be discussed. Count circuit 500 of FIG. 5 is an embodiment which may be a subset of an embodiment represented by count circuit 400 of FIG. 4. As such, count control circuit 500 as shown in FIG. 5 may be substantially similar to count control circuit 300 of FIG. 3 and/or to count control circuit 400 of FIG. 4 with the exception being that with count control circuit 500 there is one count channel and one count circuit for the subpixels for a given pixel. As a result, the switching connections may also be different. Table 1 as described with respect to count control circuit 300 of FIG. 3 may also be utilized for count control circuit 500 of FIG. 5. At lower count rates, count control circuit 500 may operate in a similar manner as with lower count rates for count control circuit 300 and/or count control circuit 400. For middle count rates, one pair of subpixels may be routed count circuit 322 wherein subpixel 312 and subpixel 314 may couple to count circuit 322 to provide an output at readout channel 330. At higher count rates, one subpixel is routed to one output channel wherein subpixel 312 may couple to count circuit 322 to provide an output at readout channel 330. The terminals of switch 338, switch 340, and switch 342 may be in the 0 position where the 0 terminal of the switches may be grounded, for example, wherein subpixel 314, subpixel 326, and/or subpixel 318 may be grounded, and no readout is obtained from them, although the scope of the claimed subject matter is not limited in this respect.

The example arrangements of count control circuit 300 shown in FIG. 3, count control circuit 400 shown in FIG. 4, and/or count control circuit 500 shown in FIG. 5 are merely example embodiments, and other subdivisions of pixel 310 into one or more subpixels, along with other arrangements of the various components of the count control circuits, may be utilized, for example to ensure a relatively higher DQE as a function of count rate, and the scope of the claimed subject matter is not limited in these respects.

Figure 6:
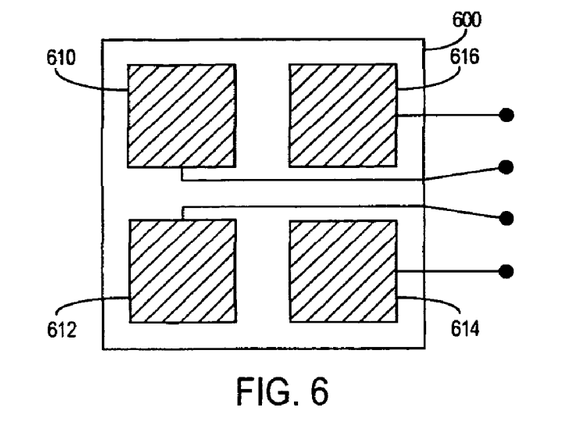
FIG. 6 is a diagram of an arrangement of subpixels for a given pixel in accordance with one or more embodiments.
Figure 7:
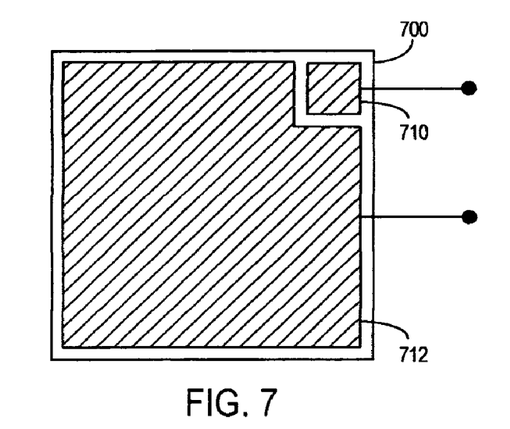
FIG. 7 is a diagram of an alternative arrangement of subpixels for a given pixel in accordance with one or more embodiments.
Figure 8:
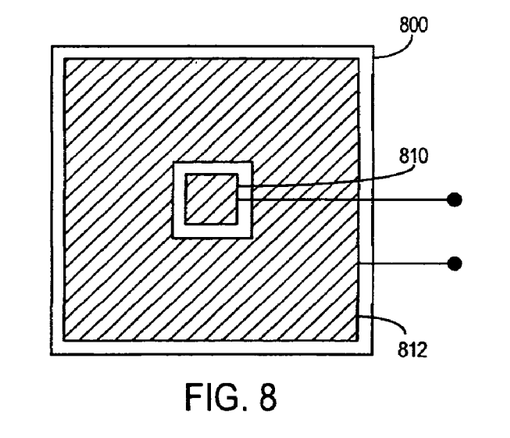
FIG. 8 is a diagram of an another alternative arrangement of subpixels for a given pixel in accordance with one or more embodiments.

Referring now to FIG. 6, FIG. 7, and FIG. 8, diagrams of subpixel arrangements in accordance with one or more embodiments will be discussed. As shown in FIG. 6, pixel 600 may comprise four equally sized, or nearly equally sized, subpixels for example subpixel 610, subpixel 612, subpixel 614, and subpixel 616. In such an arrangement of subpixels, if each subpixel has an area that is approximately equal to one-fourth the area of a pixel having an area equal to the combined size of all four subpixels, then each pixel may saturate at a flux rate equal to, or nearly equal to, four times the flux rate at which an equivalent combined size pixel may saturate. As shown in FIG. 7, pixel 700 may comprise two or more asymmetrically sized subpixels, for example subpixel 710 and subpixel 712 in an offset arrangement. In such an arrangement, if subpixel 710 has an area that is approximately one-twentieth the size of subpixel 712, then subpixel 710 may saturate at a flux rate that is 20 times, or approximately 20 times, the flux rate at which subpixel 712 may saturate. As shown in FIG. 8, pixel 800 may comprise subpixel 810 and subpixel 812 in a concentric arrangement. In such an arrangement, if subpixel 810 has an area that is approximately one-twentieth the size of subpixel 812, then subpixel 810 may saturate at a flux rate that is 20 times, or approximately 20 times, the flux rate at which subpixel 812 may saturate. The arrangements of subpixels for a given pixel as shown in FIG. 6, FIG. 7, and/or FIG. 8 are merely example arrangements of subpixel structures for pixels of detector 116 of imaging system 100, and the scope of the claimed subject matter is not limited in these respects.

Figure 9:
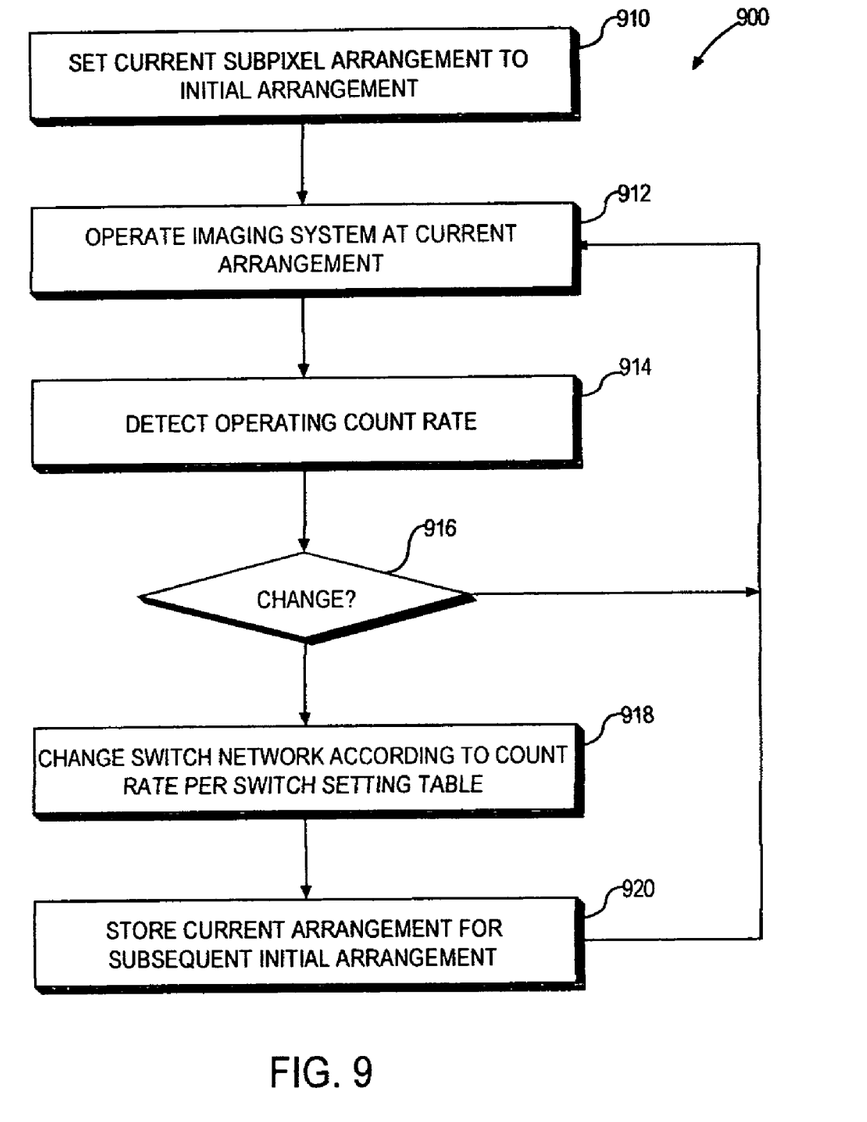
FIG. 9 is a flow diagram of a method for controlling a subpixel count control circuit in accordance with one or more embodiments.

Referring now to FIG. 9, a flow diagram of a method for controlling a subpixel count control circuit in accordance with one or more embodiments will be discussed. Method 900 may include blocks 910 through 920 in the order and/or the arrangement shown in FIG. 9, or alternatively method 900 may include more or fewer blocks, and/or in various other arrangements. In one embodiment, method 900 may be implemented by switch controller 344 of FIG. 4, FIG. 5, and/or FIG. 6, and may be implemented via hard wired logic circuit, a programmable logic circuit, hardware, firmware, and/or as a program of instructions executable by a processor of imaging system 100, although the scope of the claimed subject matter is not limited in these respects.

At block 910, a current subpixel arrangement may be set to an initial arrangement. Such an initial arrangement may be based at least in part on a power level setting of x-ray source 110, on a previous arrangement when imaging system 100 was last operated, for example as stored in a memory of imaging system 100, for example if stored at block 920, and/or as switch network 320 was last set from a previous operation of imaging system 100. Imaging system 100 may then operate at block 912 at a current subpixel arrangement which at initiation may be an initial setting. At block 914, an operating count rate may be detected during operating of imaging system 100, for example by switch controller 344 of FIG. 3, FIG. 4, and/or FIG. 5 in a feedback type arrangement. A determination may be made at block 916 whether a change of the count rate is detected, for example from a first count rate range to a second count rate range such as from a lower count rate to a middle count rate as shown in Table 1. If no change in count rate is detected, and/or if any detected change in count rate is still within a current count rate range such as indicated in Table 1, imaging system 100 may continue operation at block 912 at a current subpixel arrangement.

In one or more embodiments, in the event a change in count rate is detected, for example a change of sufficient magnitude from a first count rate to a second count rate such as from a lower count rate to a middle count rate as shown in Table 1, subpixel arrangement may change at block 918 to an updated arrangement, for example switch controller 344 may change switch network 320 according to the updated count rate in accordance with Table 1. Optionally, the updated pixel subpixel arrangement may be stored for use as an initial subpixel arrangement for a later operation of imaging system. Method 900 may then continue operation at block 912 at the updated subpixel arrangement which is the current subpixel arrangement after updating of the subpixel arrangement at block 918. Method 900 is one example method for controlling a subpixel arrangement of detector 116 of imaging system 100, and other alternative methods may be utilized for controlling a subpixel arrangement of detector 116 of imaging system 100, and the scope of the claimed subject matter is not limited in this respect.

Although the claimed subject matter has been described with a certain degree of particularity, it should be recognized that elements thereof may be altered by persons skilled in the art without departing from the spirit and/or scope of the claimed subject matter. It is believed that an imaging system or the like and/or a detector for an imaging system having adaptive subpixel routing and/or many of its attendant advantages will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. An apparatus, comprising:
    a pixel capable of detecting photons, said pixel comprising at least two subpixels, said subpixels comprising at least one of an offset subdivision of said pixel, an asymmetrical subdivision of said pixel, or a concentric subdivision of said pixel, or a combination thereof,
    a count circuit capable of counting photons detected by said pixel at a count rate based at least in part on the number of photons detected by said at least two subpixels, said count circuit being coupled to at least a first one of the subpixels; and
    a switch coupled to a second one of the subpixels;
    wherein said switch is capable of coupling the second one of the subpixels to the count circuit at a lower photon flux level, and is capable of decoupling the second one of the subpixels from the count circuit at a higher photon flux level.

2. An apparatus as claimed in claim 1, further comprising a switch controller coupled to said switch and to said count circuit, said switch controller being capable of controlling said switch based at least in part on the count rate.

3. An apparatus as claimed in claim 1, wherein said switch adaptively couples or decouples the second one of subpixels to said count circuit based at least in part on a lookup table.

4. An apparatus as claimed in claim 1, wherein said switch adaptively couples or decouples the second one of subpixels to said count circuit to at least partially optimize a detective quantum efficiency value.

5. An apparatus comprising:
    a pixel capable of detecting photons, said pixel comprising a plurality of subpixels;
    a first count circuit and a second count circuit capable of counting photons detected by said pixel at a count rate based at least in part on the number of photons detected by the subpixels
    a first switch coupled to a second one of the subpixels, wherein said first switch is capable of coupling the second one of the subpixels to the first count circuit at a lower photon flux level, and is capable of decoupling the second one of the subpixels from the first count circuit at a higher photon flux level; and
    a second switch coupled to a third one of the subpixels, wherein said second switch is capable of coupling the third one of the subpixels to the first count circuit at a lower photon flux level, and is capable of coupling the third one of the subpixels to the second count circuit at a higher photon flux level.

6. An apparatus as claimed in claim 5, wherein at a lower count rate said switch network is capable of combining an output of at least two or more subpixels at said count circuit, and at a higher count rate said switch network is capable of coupling an output of one subpixel to said count circuit without coupling at least one other subpixel to said count circuit.

7. An apparatus as claimed in claim 5, wherein said switch network is capable of combining all, or nearly all, of said subpixels to said count circuit at a lower count rate, said switch network is capable of combining an output of at least one group of said subpixels to said count circuit without coupling an output of at least one other subpixel to said count circuit at a middle count rate, and said switch network is capable of coupling an output of one subpixel to said count circuit without coupling at least one other subpixel to said count circuit at a higher count rate.

8. An apparatus as claimed in claim 5, further comprising a switch controller coupled to said switch network and to said count circuit, said switch controller being capable of controlling said switch network based at least in part on the count rate.

9. An apparatus as claimed in claim 5, wherein said at least two subpixels comprise at least one or more of an at least a nearly equal subdivision of said pixel, an offset subdivision of said pixel, an asymmetrical subdivision of said pixel, or a concentric subdivision of said pixel, or a combination thereof.

10. An apparatus as claimed in claim 5, wherein said switch network is capable of adaptively coupling a number of pixels to said at least one count circuit based at least in part on a lookup table.

11. An apparatus as claimed in claim 5, wherein said switch network is capable of adaptively coupling a number of pixels to said at least one count circuit to at least partially optimize a detective quantum efficiency value.

12. A method, comprising:
- counting photons detected by at least two or more subpixels to provide a count rate;
- at a lower count rate, combining outputs of all, or nearly all, of the subpixels at the input of a single count circuit;
- at a middle count rate, combining outputs of a first group of the subpixels at a first count circuit, and combining outputs of a second group of the subpixels at second count circuit; and
- at a higher count rate, coupling one output per pixel to a separate count circuit for all, or nearly all, of the subpixels.

13. A method as claimed in claim 12, further comprising performing said counting to at least partially optimize a detective quantum efficiency value.

14. A method as claimed in claim 12, further comprising performing said counting with a larger area of said subpixels per count circuit or performing said counting with a smaller area of said subpixels per count circuit based at least in part on a lookup table.

15. An article of manufacture comprising a machine readable medium having instructions stored thereon executable by at least one processor having one or more cores, wherein the instructions, if executed, result in:
- counting photons detected by at least two or more subpixels to provide a count rate;
- at a lower count rate, combining outputs of all, or nearly all, of the subpixels at a single count circuit;
- at a middle count rate, combining outputs of a first group of the subpixels at a first count circuit, and combining outputs of a second group of the subpixels at second count circuit; and
- at a higher count rate, coupling one output per pixel to a separate count circuit for all, or nearly all, of the subpixels.

16. An article of manufacture as claimed in claim 15, wherein the instructions, if executed, further result in performing said counting to at least partially optimize a detective quantum efficiency value.

17. An article of manufacture as claimed in claim 15, wherein the instructions, if executed, further result in performing said counting with a larger area of said subpixels per count circuit or performing said counting with a smaller area of said subpixels per count circuit based at least in part on a lookup table.

* * * * *